United States Patent
Han

(10) Patent No.: US 6,222,472 B1
(45) Date of Patent: Apr. 24, 2001

(54) AUTOMATIC GAIN CONTROLLER FOR RADIO COMMUNICATION SYSTEM

(75) Inventor: Chung-Seok Han, Kyonggi-do (KR)

(73) Assignee: Samsung Electronics, Co., Ltd. (KR)

(*) Notice: Subject to any disclaimer, the term of this patent is extended or adjusted under 35 U.S.C. 154(b) by 0 days.

(21) Appl. No.: 09/181,968

(22) Filed: Oct. 29, 1998

(30) Foreign Application Priority Data

Oct. 29, 1997 (KR) .................................................. 97-55840

(51) Int. Cl.[7] .................................................. H03M 1/18
(52) U.S. Cl. .................................................. 341/139; 455/138
(58) Field of Search .................................................. 341/139; 455/138, 455/139, 232.1, 234.1, 239.1, 240.1

(56) References Cited

U.S. PATENT DOCUMENTS

| 5,659,582 | * | 8/1997 | Kojima | 455/234.1 |
| 5,784,410 | * | 7/1998 | Nakano | 455/234.1 |

FOREIGN PATENT DOCUMENTS

| 5-075664 | * | 3/1993 | (JP) | H04L/27/38 |

OTHER PUBLICATIONS

JPO Abstract and front page of JP 7-288485, Kojima and Uchiki Oct. 31, 1995.*

* cited by examiner

*Primary Examiner*—Howard L. Williams
(74) *Attorney, Agent, or Firm*—Dilworth & Barrese, LLP

(57) ABSTRACT

An automatic gain controller for reducing the required code size and processing burden of a digital signal processor (DSP) chip. The automatic gain controller includes an automatic gain control (AGC) amplifier and an A/D converter for converting an analog signal output from the AGC amplifier to a digital signal. A power estimator estimates a power of a signal input from the A/D converter. An infinite impulse response (IIR) filter filters the power output from the power estimator to attenuate noises and interferences. A comparator receives the filtered power output from the filter and generates an AGC control gain. A dB-to-D/A input converter converts the AGC control gain output from the comparator to a D/A input signal. A D/A converter converts the D/A input signal output from the dB-to-D/A input converter to an analog AGC control signal and provides the AGC control signal to the AGC amplifier.

3 Claims, 2 Drawing Sheets

| POWER LEVEL | | AGC CONTROL GAIN |
|---|---|---|
| Thr_Power 3dB | | decreased 3dB |
| Thr_Power 1dB | | decreased 1dB |
| 0dB | | 0dB |
| Thr_Power −1dB | | increased 1dB |
| Thr_Power −3dB | | increased 3dB |

AUTOMATIC GAIN CONTROLLER FOR RADIO COMMUNICATION SYSTEM

BACKGROUND OF THE INVENTION

1. Field of the Invention

The present invention relates to an automatic gain controller for compensating for an amplitude variation of a received signal in a radio communication system and more particularly relates to an automatic gain controller for reducing a code size of a digital signal processor (DSP).

2. Description of the Related Art

Radio communication systems often suffer from a fading phenomenon which causes an amplitude variation in a received signal. To compensate for the amplitude variation, radio communication systems often utilize an automatic gain controller (AGC). AGC circuits provide a substantially constant output amplitude in response to a varying input signal amplitude.

FIG. 1 illustrates a block diagram of a conventional automatic gain controller. Referring to the drawing, an automatic gain control (AGC) amplifier 11 amplifies an input signal according to an AGC control signal. An analog-to-digital (A/D) converter 12 converts an analog signal output from the AGC amplifier 11 to a digital signal. A power estimator 13 estimates a power of a signal output from the A/D converter 12. An AGC controller 14 receives an AGC reference value and the power estimated in the power estimator 13 to calculate an AGC gain. The power estimator 13 converts the calculated AGC gain to a digital dB (decibel) value. A digital-to-analog (D/A) converter 15 converts the digital dB value output from the AGC controller 14 to the analog AGC control signal and provides the AGC control signal to the AGC amplifier 11.

Conventionally, the AGC controller 14 is a complex structure, since it must calculate the AGC reference value and the estimation value of the power estimator 13 in real time. With advances in digital signal processor (DSP) chips, there is an increasing tendency to utilize a DSP chip as a processor for the communications system and have the DSP perform the function of the automatic gain controller. However, utilizing the DSP as the AGC controller 14 places a significant calculation burden on the DSP, which may result in an overload on the DSP chip. In addition, to incorporate additional functions into the DSP chip, it is necessary to reduce the DPS code in size (or length) for respective software modules.

SUMMARY OF THE INVENTION

It is therefore an object of the present invention to provide an automatic gain controller for reducing a DSP code in size.

To achieve the above object, there is provided an automatic gain controller including an automatic gain control amplifier and an A/D converter for converting an analog signal output from the AGC amplifier to a digital signal. In the automatic gain controller, a power estimator connected to the A/D converter, estimates a power of a signal input from the A/D converter. A filter connected to the power estimator filters the power output from the power estimator to attenuate noises and interferences. A comparator connected to the filter receives the filtered power output from the filter and generates an AGC control gain. A dB-to-D/A input converter connected to the comparator converts the AGC control gain output from the comparator to a D/A input signal. A D/A converter connected to the dB-to-D/A input converter converts the D/A input signal output from the dB-to-D/A input converter to an analog AGC control signal and provides the AGC control signal to the AGC amplifier.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Preferred embodiments of the present invention will be described in detail with reference to the attached drawings. Though specific embodiments will be exemplarily defined and described in detail to clarify the subject matter of the present invention, the present invention may be implemented with the description of the present invention by those skilled in the art even without such details. In addition, detailed descriptions of widely known functions and constructions may be omitted.

Figure 1:
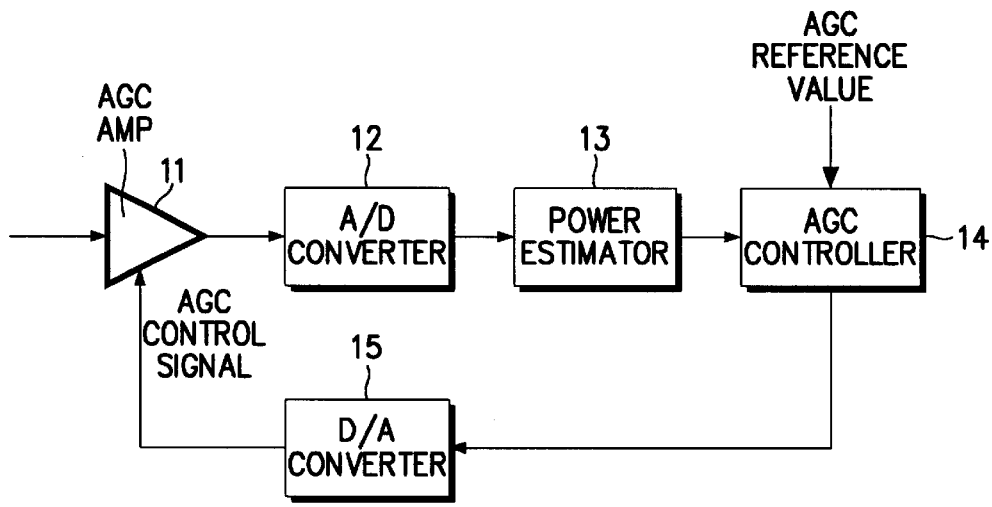
FIG. 1 is a block diagram of a conventional automatic gain controller.
Figure 2:
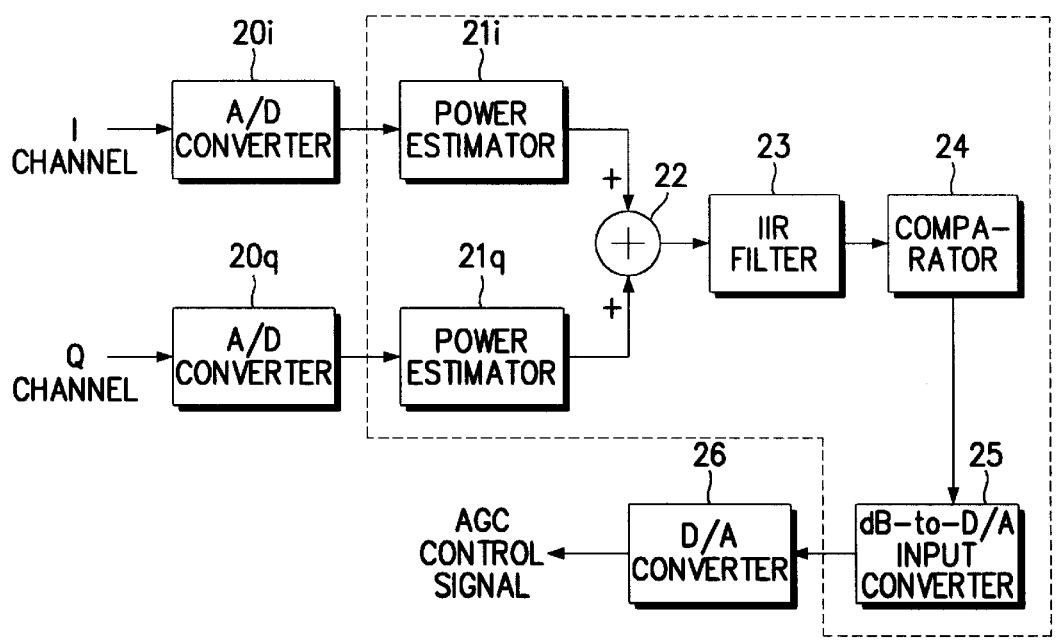
FIG. 2 is a block diagram of an automatic gain controller according to an embodiment of the present invention.

FIG. 2 illustrates a block diagram of an automatic gain controller according to an embodiment of the present invention. Referring to the drawing, first and second AID converters 20$i$, 20$q$ convert analog signals input from I and Q channels to digital signals, respectively. Power estimators 21$i$, 21$q$ estimate the received power of the signals output from the A/D converters 20$i$ and 20$q$, respectively. A summer 22 adds the powers estimated in the power estimators 21$i$ and 21$q$, to calculate a total input power P, represented by the following equation (1).

$$P = \sum_{k=0}^{n-1} (I_k)^2 + \sum_{k=0}^{n-1} (Q_k)^2 \qquad (1)$$

where n represents a number used to calculate the input power.

An IIR (Infinite Impulse Response) filter 23 filters the power P input from the summer 22 to remove noise and interference from the desired signal. The IIR filter 23 is realized by the following equation (2).

Filter Output Power $[i]$=(1−α)×Filter Output Power $[i-1]$+α+$P[i]$ \qquad (2)

where α should be large enough to search the channel at high speed and small enough to reduce the noises and interferences.

Figures 3, 4:
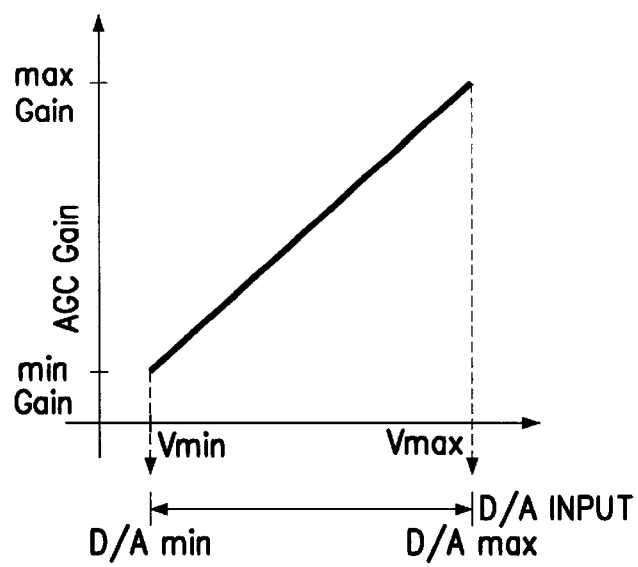
FIG. 3 is a diagram illustrating a characteristic of a comparator (24) of FIG. 2.
FIG. 4 is a diagram illustrating a characteristic of a dB-to-D/A input converter (25) of FIG. 2.

A comparator 24 compares the power output from the IIR filter 23 with a desired reference power level. FIG. 3 illustrates the characteristic of the comparator 24, in which the comparator 24 can be divided into several regions in the dB unit according to a correction rate of the automatic gain controller on the basis of a desired power. Here, the desired power is a set input signal level to be maintained in the automatic gain controller. Threshold values at the respective regions based on the desired power are calculated by the following equation (3):

$$x\text{dB} = 10 \log \frac{Thr\_power\_xdB}{\text{Desired Power}} \quad (3)$$

where x= ..., −3, −1, +1, +3, ..., and is related to a gain control velocity and a resolution. In the embodiment, +3, +1, −1 and −3 are taken by way of example. The comparator 24 receives the power output from the IIR filter 23 and outputs an AGC control gain (dB value) according to the set power level.

A dB-to-D/A input converter 25 converts the AGC control gain (dB value) determined in the comparator 24 to an AGC control level for controlling the automatic gain controller. FIG. 4 illustrates the characteristic of the dB-to-D/A input converter 25. With reference to FIG. 4, the dB-to-D/A input converter 25 measures D/A input values for output voltages corresponding to the minimum and maximum gains and then outputs a D/A input corresponding to an input correction gain by utilizing a linearity relationship between the AGC gain and the D/A input. Accordingly, when the correction gain to be adjusted is received, the dB-to-D/A input converter 25 outputs the D/A input represented by the following equation (4):

$$\text{D/A input}=(\text{Correction Gain—Minimum Gain})/s+\text{D/Amin} \quad (4)$$

where s is a gain adjusted per LSB (Least Significant Bit) of the D/A. The value s is expressed by the following equation (5):

$$s = \frac{\max \text{Gain} - \min \text{Gain}}{D/A\max - D/A\min} \quad (5)$$

A D/A converter 26 converts the D/A input received from the dB-to-D/A input converter 25 to an analog AGC control signal for controlling the automatic gain controller and provides the AGC control signal to an AGC amplifier (not shown).

Preferably, the power estimators 21i and 21q, the summer 22, the IIR filter 23, the comparator 24 and the dB-to-D/A input converter 25 are built in the same DSP chip.

As described above, the automatic gain controller according to the present invention can reduce the DSP code by utilizing the comparator to reduce the computational burden, thereby solving the overload problem of the DSP chip.

While the invention has been shown and described with reference to a certain preferred embodiment thereof, it will be understood by those skilled in the art that the invention should not be limited to the specific embodiment illustrated above.

What is claimed is:

1. An automatic gain controller including an automatic gain control (AGC) amplifier and an analog-to-digital (A/D) converter for converting an analog signal output from the AGC amplifier to a digital signal, said automatic gain controller comprising:

a power estimator connected to the A/D converter, for estimating a power of a signal input from the A/D converter;

an IIR (Infinite Impulse Response) filter connected to the power estimator, for filtering the power output from the power estimator to attenuate noises and interferences;

a comparator connected to the IIR filter, for receiving the filtered power output from the IIR filter and generating an AGC control gain, wherein said comparator compares the power output from the IIR filter with a plurality of regions, each of said regions having a minimum and maximum threshold value and, upon reaching any one of the threshold values, outputs an AGC correction gain value corresponding to the reached threshold value;

a dB-to-D/A (Digital-to-Analog) input converter connected to the comparator, for converting the AGC correction gain output from the comparator to a D/A input signal; and a D/A converter connected to the dB-to-D/A input converter, for converting the D/A input signal output from the dB-to-D/A input converter to an analog AGC control signal and providing the AGC control signal to the AGC amplifier.

2. An automatic gain controller including an automatic gain control (AGC) amplifier and first and second analog-to-digital (A/D) converters for converting an analog signal output from the AGC amplifier in a first and second channel to first and second digital signals, respectively, said automatic gain controller comprising:

a first power estimator connected to the first A/D converter, for estimating a power of a signal input in the first A/D converter channel;

a second power estimator operatively coupled to the second AND converter, for estimating a power of a signal input in the second A/D converter channel;

a summer, said summer receiving the signal from the first and second A/D converters and providing a sum power signal representing the combined power in the first and second A/D channels;

an IIR (Infinite Impulse Response) filter, said filter being operatively coupled to the summer, for filtering the sum power signal to attenuate noises and interferences;

a comparator, said comparator receiving the filtered sum power output from the IIR filter and generating an AGC control gain, wherein said comparator compares the power output from the IIR filter with a plurality of regions, each of said regions having a minimum and maximum threshold value and, upon reaching any one of the threshold values, outputs an AGC correction gain value corresponding to the reached threshold value;

a dB-to-D/A (Digital-to-Analog) input converter connected to the comparator, for converting the AGC correction gain output from the comparator to a D/A input signal; and a D/A converter connected to the dB-to-D/A input converter, for converting the D/A input signal output from the dB-to-D/A input converter to an analog AGC control signal and providing the AGC control signal to the AGC amplifier.

3. The automatic gain controller as claimed in claim 2, wherein the first and second A/D channels are I and Q channels, respectively.

* * * * *